United States Patent
Yoshikawa

(10) Patent No.: US 8,471,530 B2
(45) Date of Patent: Jun. 25, 2013

(54) BATTERY STATE MONITORING CIRCUIT AND BATTERY DEVICE

(75) Inventor: Kiyoshi Yoshikawa, Chiba (JP)

(73) Assignee: Seiko Instruments Inc. (JP)

( * ) Notice: Subject to any disclaimer, the term of this patent is extended or adjusted under 35 U.S.C. 154(b) by 193 days.

(21) Appl. No.: 13/049,402

(22) Filed: Mar. 16, 2011

(65) Prior Publication Data

US 2011/0227539 A1 Sep. 22, 2011

(30) Foreign Application Priority Data

Mar. 19, 2010 (JP) ................................. 2010-065138

(51) Int. Cl.
*H02J 7/00* (2006.01)
*G01R 31/36* (2006.01)

(52) U.S. Cl.
USPC ........... 320/134; 320/149; 320/155; 324/426; 340/636.1; 340/636.21

(58) Field of Classification Search
USPC ....................................................... 320/134
See application file for complete search history.

(56) References Cited

U.S. PATENT DOCUMENTS

| | | | | |
|---|---|---|---|---|
| 5,929,593 A * | 7/1999 | Eguchi | ............................. | 320/139 |
| 6,054,843 A * | 4/2000 | Oglesbee et al. | ............. | 320/136 |
| 6,239,579 B1 * | 5/2001 | Dunn et al. | ..................... | 320/121 |
| 6,492,791 B1 * | 12/2002 | Saeki et al. | ..................... | 320/135 |
| 7,595,609 B2 * | 9/2009 | Wang et al. | ..................... | 320/134 |
| 2001/0026147 A1 * | 10/2001 | Nakashimo | ..................... | 320/134 |
| 2005/0077878 A1 * | 4/2005 | Carrier et al. | ..................... | 320/134 |
| 2005/0242779 A1 * | 11/2005 | Yoshio | ............................. | 320/134 |
| 2008/0203971 A1 * | 8/2008 | Sakurai et al. | ..................... | 320/134 |
| 2008/0224664 A1 * | 9/2008 | Sano et al. | ..................... | 320/134 |
| 2009/0051323 A1 * | 2/2009 | Sato et al. | ..................... | 320/134 |
| 2009/0072790 A1 * | 3/2009 | Ibrahim | ..................... | 320/134 |

FOREIGN PATENT DOCUMENTS

JP 2000-056843 A 2/2000

\* cited by examiner

*Primary Examiner* — Yalkew Fantu
(74) *Attorney, Agent, or Firm* — Brinks Hofer Gilson & Lione

(57) ABSTRACT

Provided is a battery state monitoring circuit including: a charge/discharge control circuit for detecting and controlling a state of a secondary battery; an automatic recovery circuit; a temperature sensor circuit; and a comparator for comparing a voltage of an output terminal of the automatic recovery circuit and a voltage of the secondary battery, and outputting a signal indicative of a result of the comparison to the temperature sensor circuit, to control an operation of the temperature sensor circuit. The temperature sensor circuit operates only when the output of the automatic recovery circuit is larger, that is, only when a charger is connected between external terminals.

6 Claims, 3 Drawing Sheets

BATTERY STATE MONITORING CIRCUIT AND BATTERY DEVICE

RELATED APPLICATIONS

This application claims priority under 35 U.S.C. §119 to Japanese Patent Application No. 2010-065138 filed on Mar. 19, 2010, the entire content of which is hereby incorporated by reference.

BACKGROUND OF THE INVENTION

1. Field of the Invention

The present invention relates to a battery state monitoring circuit for detecting a voltage and an abnormality of a secondary battery and a battery device including the battery state monitoring circuit, and more particularly, to a battery state monitoring circuit incorporating a temperature sensor in a charge/discharge control circuit and a battery device including the battery state monitoring circuit.

2. Description of the Related Art

FIG. 3 illustrates a circuit diagram of a conventional battery device incorporating a temperature sensor. The conventional battery device incorporating the temperature sensor includes a secondary battery 101, a battery state monitoring circuit 309, an external terminal 106, and an external terminal 107. The battery state monitoring circuit 309 includes an overcharge detection circuit 301, an overdischarge detection circuit 305, a control circuit 302, an overheat detection circuit 304, a temperature sensor 307, an overcurrent detection circuit 303, a discharge field-effect transistor (FET) 306, a charge FET 308.

Connection is made as follows. The positive terminal side of the secondary battery 101 is connected to the overcharge detection circuit 301, the overdischarge detection circuit 305, and the external terminal 106, and the negative terminal side thereof is connected to a source of the discharge FET 306. The control circuit 302 is connected to an output of the overcharge detection circuit 301, an output of the overdischarge detection circuit 305, an output of the overcurrent detection circuit 303, and an output of the overheat detection circuit 304. The discharge FET 306 has a gate connected to an output of the control circuit 302 and a drain connected to a drain of the charge FET 308. The charge FET 308 has a gate connected to another output of the control circuit 302 and a source connected to an input of the overcurrent detection circuit 303 and the external terminal 107.

When the charge FET 308 enters an abnormal overheated state due to overcurrent during charge, the overheat detection circuit 304 notifies the control circuit 302 of the abnormal state so that the control circuit 302 operates to change the gate of the charge FET 308 to L to disconnect a charge current. Therefore, the charge FET 308 for charge control can be protected from abnormal overheat (see, for example, Japanese Patent Application Laid-open No. 2007-124775).

The battery device needs overheat protection by a temperature sensor circuit even when the secondary battery is charged from 0 V. The temperature sensor circuit obtains power from between the external terminals because, otherwise if the power is obtained from the secondary battery side, the temperature sensor circuit does not operate when the battery voltage is 0 V, and hence the overheat protection does not work. In the conventional technology, however, current consumption of the temperature sensor circuit is a load to an automatic recovery circuit, and hence there is a problem that the automatic recovery circuit cannot operate normally at the time of recovery from an overcurrent protection state using an automatic recovery function. This is because the automatic recovery circuit outputs a minute current so as to suppress consumption of the battery and the output current of the automatic recovery circuit is completely consumed by the overheat detection circuit to hinder the automatic recovery operation.

SUMMARY OF THE INVENTION

The present invention has been made to solve the problem described above, and provides a battery state monitoring circuit in which an automatic recovery function normally works, thereby being capable of lowering power consumption, and also provides a battery device including the battery state monitoring circuit.

In order to solve the conventional problem, a battery device including a battery state monitoring circuit according to the present invention has the following configuration.

The battery state monitoring circuit includes: a charge/discharge control circuit for detecting and controlling a state of a secondary battery; an automatic recovery circuit; a temperature sensor circuit; and a comparator for comparing a voltage of an output terminal of the automatic recovery circuit, that is, an overcurrent detection terminal and a voltage of the secondary battery, and controlling an operation of the temperature sensor circuit by an output signal indicative of a result of the comparison.

According to the battery device of the present invention, it is possible to suspend the operation of the temperature sensor circuit until the voltage of the overcurrent detection terminal becomes higher than a voltage of a positive terminal of the secondary battery, that is, until the connection of a charger is established. As a result, the function of automatic recovery from an overcurrent protection state can normally work. The comparator obtains power from the output of the automatic recovery circuit, that is, from the overcurrent detection terminal. However, the current consumption of the comparator is tiny enough not to hinder the operation of the automatic recovery.

DETAILED DESCRIPTION OF THE PREFERRED EMBODIMENTS

Referring to the accompanying drawings, modes for embodying the present invention are described.

First Embodiment

Figure 1:
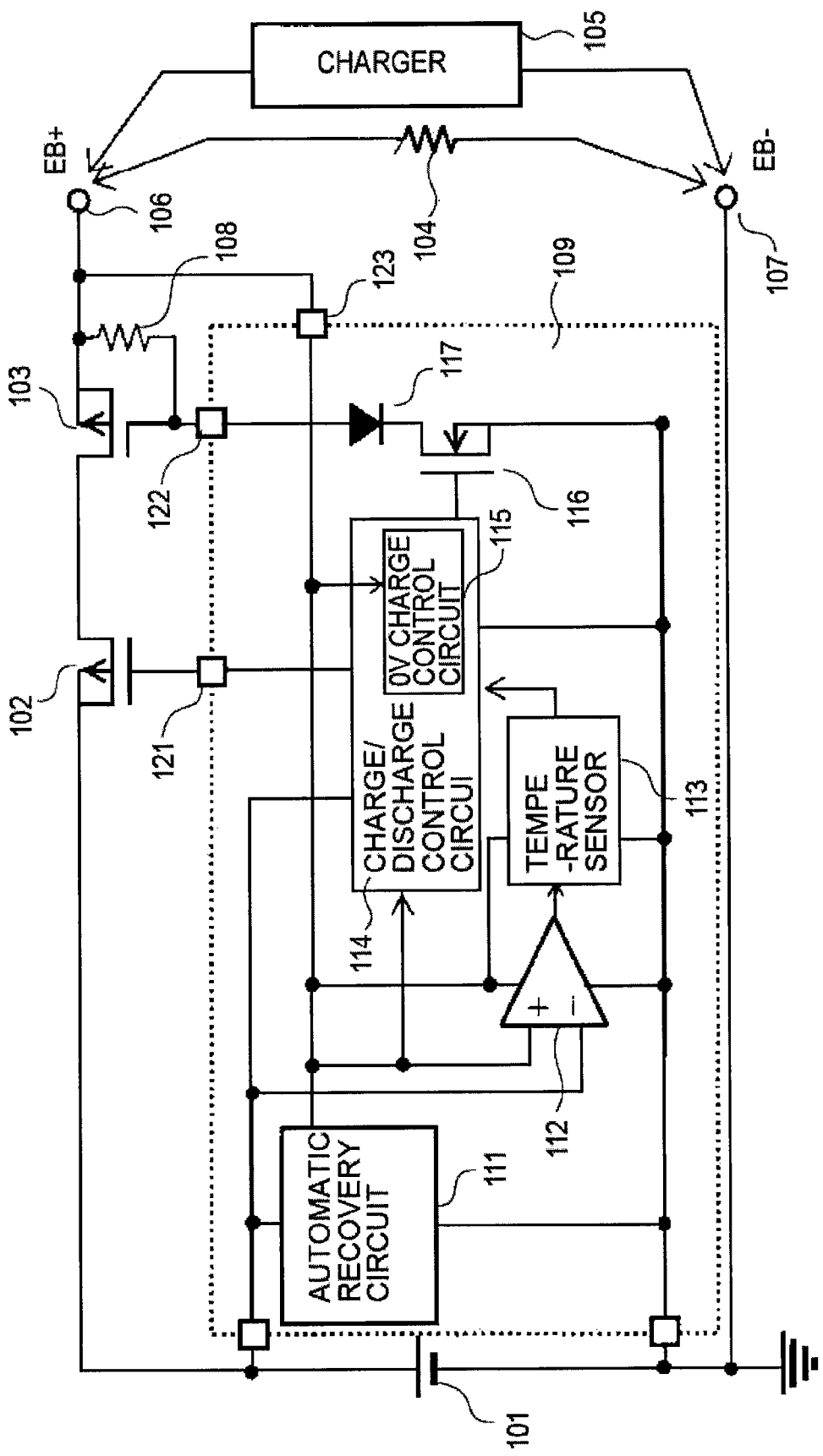
FIG. 1 is a circuit diagram of a battery device including a battery state monitoring circuit according to a first embodiment of the present invention.

FIG. 1 is a circuit diagram of a battery device including a battery state monitoring circuit according to a first embodiment of the present invention.

The battery device according to the first embodiment includes a secondary battery 101, a battery state monitoring circuit 109, a discharge control P-channel field-effect transistor (FET) 102, a charge control P-channel FET 103, external terminals 106 and 107 to which a load 104 or a charger 105 is to be connected, a resistor 108. The battery state monitoring circuit 109 includes an automatic recovery circuit 111, a comparator 112, a temperature sensor circuit 113, a charge/discharge control circuit 114, a 0 V charge control circuit 115, an NMOS transistor 116, and a diode 117.

The automatic recovery circuit 111 and the charge/discharge control circuit 114 use the secondary battery 101 as power supply. The comparator 112, the temperature sensor circuit 113, and the 0 V charge control circuit 115 are each connected to an overcurrent detection terminal 123 for positive power supply and connected to a negative terminal of the secondary battery 101 for negative power supply.

The automatic recovery circuit 111 has an output connected to the overcurrent detection terminal 123. The comparator 112 has a non-inverting input terminal connected to the overcurrent detection terminal 123, an inverting input terminal connected to a positive terminal of the secondary battery 101, and an output connected to the temperature sensor circuit 113. The temperature sensor circuit 113 has an output connected to the charge/discharge control circuit 114. The charge/discharge control circuit 114 has an input connected to the overcurrent detection terminal 123, one output connected to a discharge control output terminal 121, and another output connected to a gate of the NMOS transistor 116. The NMOS transistor 116 has a source connected to the negative terminal of the secondary battery 101 and a drain connected to a cathode of the diode 117. The diode 117 has an anode connected to a charge control output terminal 122. The 0 V charge control circuit 115 has an input connected to the overcurrent detection terminal 123, and is included in the charge/discharge control circuit 114. The discharge control P-channel FET 102 has a gate connected to the discharge control output terminal 121, a source connected to the positive terminal of the secondary battery 101, and a drain connected to a drain of the charge control P-channel FET 103. The charge control P-channel FET 103 has a gate connected to the charge control output terminal 122 and a source connected to the external terminal 106. The resistor 108 has one end connected to the charge control output terminal 122 and another end connected to the external terminal 106. The overcurrent detection terminal 123 is connected to the external terminal 106, and the external terminal 107 is connected to the negative terminal of the secondary battery 101.

The comparator 112 has a slight positive offset at the non-inverting input terminal, and outputs a signal of H when a voltage of the overcurrent detection terminal 123 becomes higher than a voltage of the positive terminal of the secondary battery 101 by the offset voltage. The temperature sensor circuit 113 suspends its operation in response to a signal of L received from the comparator 112, and starts the operation in response to the signal of H.

Next, an operation of the battery device according to the first embodiment is described.

When a heavy load is connected between the external terminals 106 and 107, the charge/discharge control circuit 114 detects overcurrent and enables an overcurrent protection function to turn OFF the discharge control P-channel FET 102. The voltage of the overcurrent detection terminal 123 is reduced to around 0 V. The automatic recovery circuit 111 operates in preparation for automatic recovery when the heavy load is removed, and supplies a current to the overcurrent detection terminal 123. After that, when the heavy load is removed, the voltage of the overcurrent detection terminal 123 increases gradually. At this time, because the comparator 112 has the slight positive offset at the non-inverting input terminal, the comparator 112 outputs the signal of L to suspend the circuit operation of the temperature sensor circuit 113. Then, the charge/discharge control circuit 114 detects that the heavy load has been removed, and turns ON the discharge control P-channel FET 102. This way, the voltage of the overcurrent detection terminal 123 becomes equal to the voltage of the positive terminal of the secondary battery 101.

The positive offset voltage at the non-inverting input terminal of the comparator 112 is set to a voltage lower than a value determined by multiplying the sum of an ON-state resistance of the discharge control P-channel FET 102 and an ON-state resistance of the charge control P-channel FET 103 by a charge current of the charger 105. The comparator 112 obtains power from the output of the automatic recovery circuit 111, that is, from the external terminal 106, but does not hinder the operation of automatic recovery because the comparator 112 is designed to have tiny current consumption.

After that, when the charger 105 is connected between the external terminals 106 and 107, the voltage of the overcurrent detection terminal 123 is increased to be higher than the voltage of the positive terminal of the secondary battery 101. Then, the comparator 112 outputs the signal of H so that the temperature sensor circuit 113 operates. This way, the temperature sensor circuit 113 operates only after the voltage of the overcurrent detection terminal 123 becomes higher than the voltage of the positive terminal of the secondary battery 101. Therefore, the automatic recovery function can work successfully.

The temperature sensor circuit 113 operates only when the voltage of the overcurrent detection terminal 123 is higher than the voltage of the positive terminal of the secondary battery 101. In other words, the temperature sensor circuit 113 operates only when the charger 105 is connected between the external terminals 106 and 107. Therefore, in a normal state in which the charger 105 is not connected, the temperature sensor circuit 113 does not operate, to thereby lower current consumption.

Next, an operation of overheat protection at the time of charge when the secondary battery 101 has been discharged to around 0 V is described. When the charger 105 is connected, the 0 V charge control circuit 115 operates to change a gate voltage of the NMOS transistor 116 to H via the output of the charge/discharge control circuit 114 to turn ON the NMOS transistor 116. Then, a current flows to the negative terminal of the secondary battery 101 from the external terminal 106 via the resistor 108, the charge control output terminal 122, the diode 117, and the NMOS transistor 116. This current causes voltage drop across the resistor 108 to increase a source-gate voltage of the charge control P-channel FET 103. Accordingly, the charge control P-channel FET 103 is turned ON. The requirement for turning ON the charge control P-channel FET 103 is to apply a voltage of VTH or higher as the gate-source voltage. Because the secondary battery 101 is 0 V, when the charge control P-channel FET 103 is electrically connected, a source voltage thereof is decreased but the gate-source voltage stops at the voltage of VTH or higher. The voltage between the external terminals 106 and 107 at this time is a voltage substantially equal to the sum of a Vf voltage of the diode 117 and the voltage VTH of the charge control P-channel FET 103. This voltage is higher than the positive terminal voltage of the secondary battery 101, and hence the comparator 112 outputs H, which is high enough for the temperature sensor circuit 113 to operate. Therefore, the temperature sensor circuit 113 starts the circuit operation to enable the overheat protection function.

Second Embodiment

Figure 2:
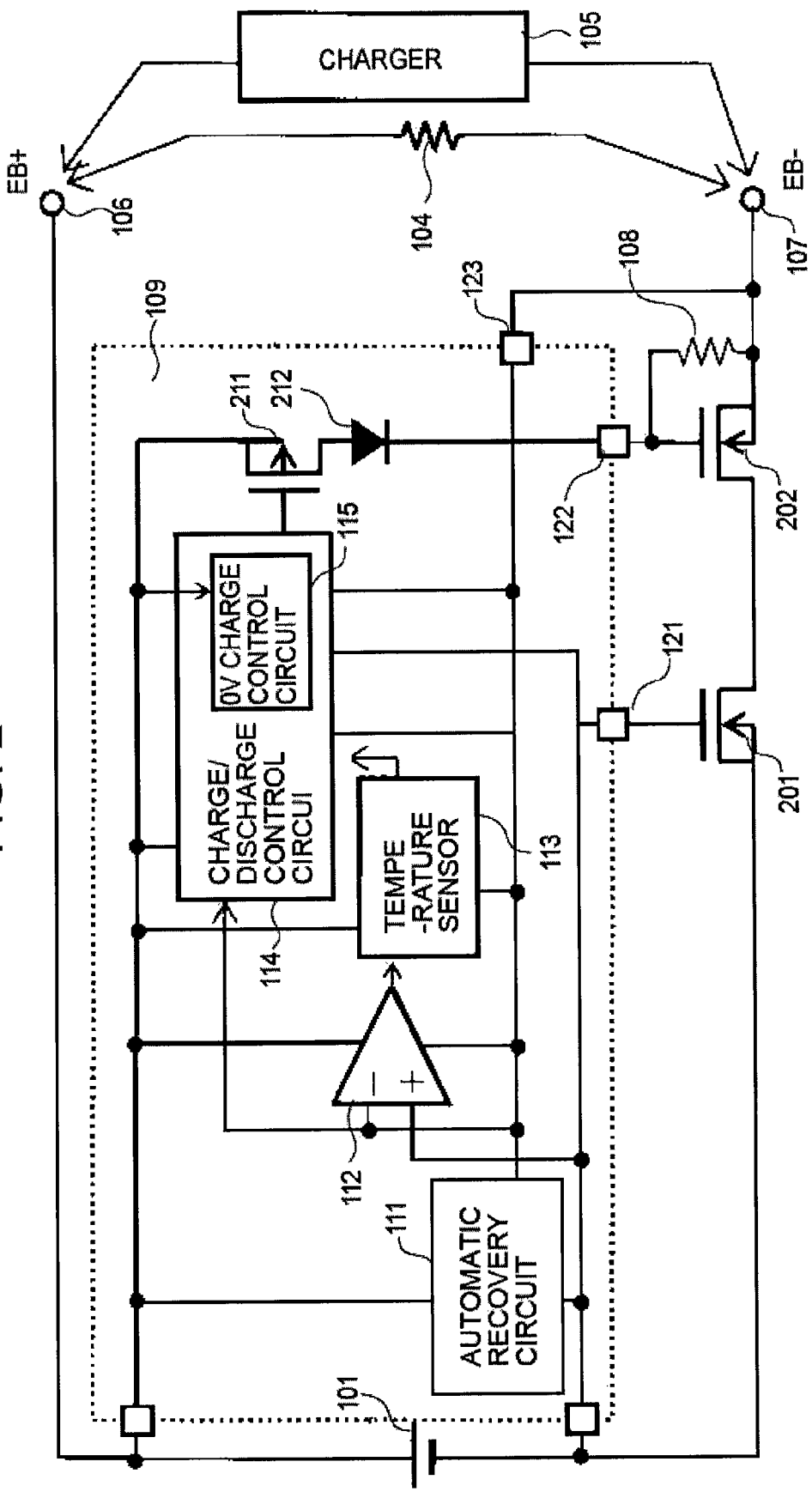
FIG. 2 is a circuit diagram of a battery device including a battery state monitoring circuit according to a second embodiment of the present invention.
Figure 3:
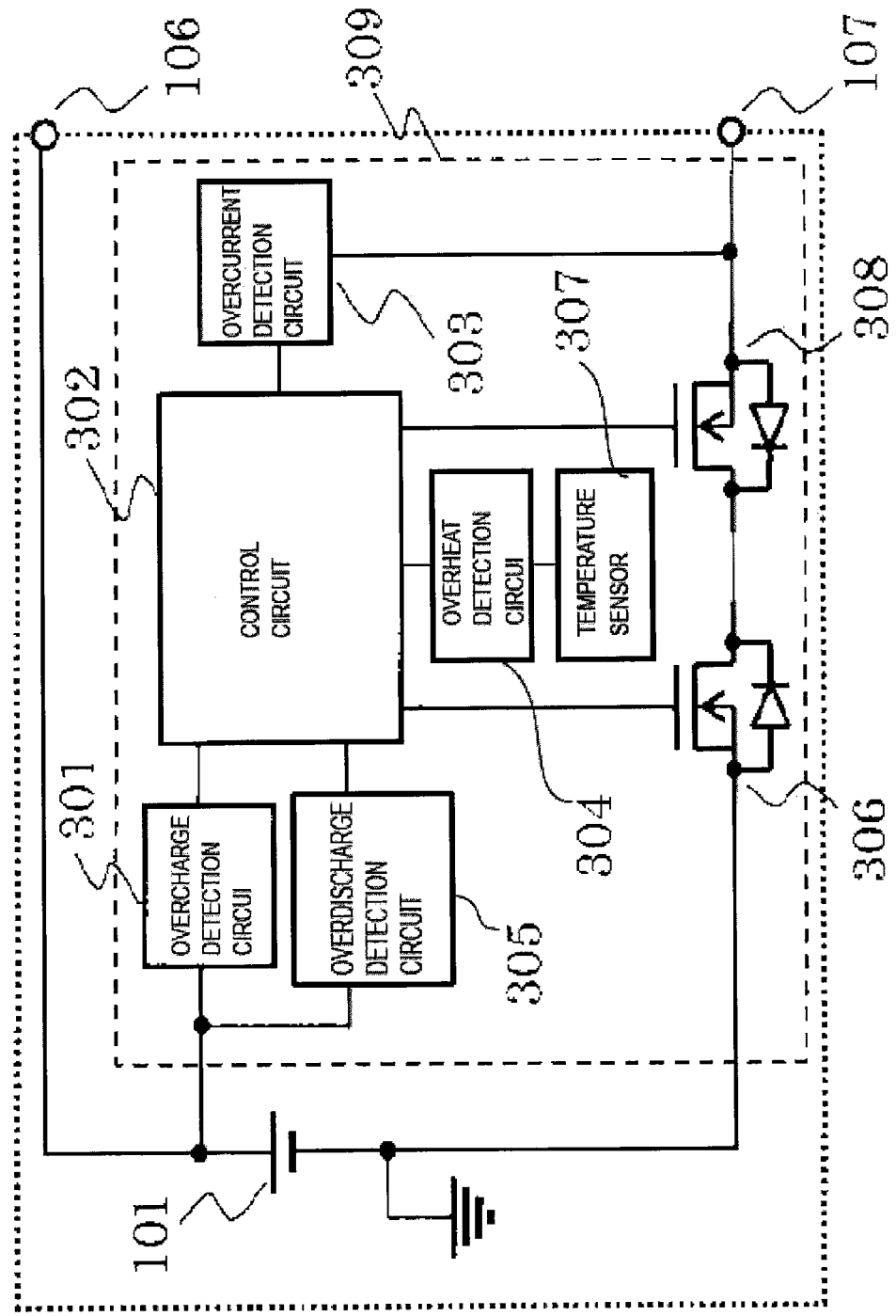
FIG. 3 is a circuit diagram of a conventional battery device including a battery state monitoring circuit.

FIG. 2 is a circuit diagram of a battery device including a battery state monitoring circuit according to a second embodiment of the present invention. FIG. 2 is different from FIG. 1 in that the discharge control P-channel FET 102, the charge control P-channel FET 103, the NMOS transistor 116, and the diode 117 are changed to a discharge control N-channel FET 201, a charge control N-channel FET 202, a PMOS transistor 211, and a diode 212, respectively.

Connection is made as follows. The automatic recovery circuit 111 and the charge/discharge control circuit 114 use the secondary battery 101 as power supply. The comparator 112, the temperature sensor circuit 113, and the 0 V charge control circuit 115 are each connected to the overcurrent detection terminal 123 for negative power supply and connected to the positive terminal of the secondary battery 101 for positive power supply.

The PMOS transistor 211 has a gate connected to the output of the charge/discharge control circuit 114, a source connected to the positive terminal of the secondary battery 101, and a drain connected to an anode of the diode 212. The diode 212 has a cathode connected to the charge control output terminal 122. The discharge control N-channel FET 201 has a gate connected to the discharge control output terminal 121, a source connected to the negative terminal of the secondary battery 101, and a drain connected to a drain of the charge control N-channel FET 202. The charge control N-channel FET 202 has a gate connected to the charge control output terminal 122 and a source connected to the external terminal 107. The resistor 108 has one end connected to the charge control output terminal 122 and another end connected to the external terminal 107. The overcurrent detection terminal 123 is connected to the external terminal 107, and the external terminal 106 is connected to the positive terminal of the secondary battery 101.

Next, an operation is described. When a heavy load is connected between the external terminals 106 and 107, the charge/discharge control circuit 114 detects overcurrent and enables the overcurrent protection function to turn OFF the discharge control N-channel FET 201. Then, the voltage of the overcurrent detection terminal 123 becomes substantially equal to the voltage of the external terminal 106. The automatic recovery circuit 111 operates in preparation for automatic recovery when the heavy load is removed, and supplies a current to the negative terminal of the secondary battery 101 from the overcurrent detection terminal 123. After that, when the heavy load is removed, the voltage of the overcurrent detection terminal 123 decreases gradually. At this time, because the comparator 112 has the slight positive offset at the non-inverting input terminal, the comparator 112 outputs the signal of L to suspend the circuit operation of the temperature sensor circuit 113. Then, the charge/discharge control circuit 114 detects that the heavy load has been removed, and turns ON the discharge control N-channel FET 201. This way, the voltage of the overcurrent detection terminal 123 becomes equal to the voltage of the negative terminal of the secondary battery 101.

The positive offset voltage at the non-inverting input terminal of the comparator 112 is set to a voltage lower than a value determined by multiplying the sum of an ON-state resistance of the discharge control N-channel FET 201 and an ON-state resistance of the charge control N-channel FET 202 by a charge current of the charger 105. The comparator 112 obtains power from the output of the automatic recovery circuit 111, that is, from the external terminal 106, but does not hinder the operation of automatic recovery because the comparator 112 is designed to have tiny current consumption.

After that, when the charger 105 is connected between the external terminals 106 and 107, the voltage of the overcurrent detection terminal 123 is decreased to be lower than the voltage of the negative terminal of the secondary battery 101. Then, the comparator 112 outputs the signal of H so that the temperature sensor circuit 113 operates. This way, the temperature sensor circuit 113 operates only after the voltage of the overcurrent detection terminal 123 becomes lower than the voltage of the negative terminal of the secondary battery 101. Therefore, the automatic recovery function can work successfully.

The temperature sensor circuit 113 operates only when the voltage of the overcurrent detection terminal 123 is lower than the voltage of the negative terminal of the secondary battery 101. In other words, the temperature sensor circuit 113 operates only when the charger 105 is connected between the external terminals 106 and 107. Therefore, in a normal state in which the charger 105 is not connected, the temperature sensor circuit 113 does not operate, to thereby lower current consumption.

Next, an operation of overheat protection at the time of charge when the secondary battery 101 has been discharged to around 0 V is described. When the charger 105 is connected, the 0 V charge control circuit 115 operates to change a gate voltage of the PMOS transistor 211 to L via the output of the charge/discharge control circuit 114 to turn ON the PMOS transistor 211. Then, a current flows to the external terminal 107 from the positive terminal of the secondary battery 101 via the PMOS transistor 211, the diode 212, the charge control output terminal 122, and the resistor 108. This current causes voltage drop across the resistor 108 to increase a source-gate voltage of the charge control N-channel FET 202. Accordingly, the charge control N-channel FET 202 is turned ON. The requirement for turning ON the charge control N-channel FET 202 is to apply a voltage of VTH or higher as the gate-source voltage. Because the secondary battery 101 is 0 V, when the charge control N-channel FET 202 is electrically connected, a source voltage thereof is increased but the gate-source voltage stops at the voltage of VTH or higher. The voltage between the external terminals 106 and 107 at this time is a voltage substantially equal to the sum of a Vf voltage of the diode 212 and the voltage VTH of the charge control N-channel FET 202. This voltage is lower than the negative terminal voltage of the secondary battery 101, and hence the comparator 112 outputs H, which is high enough for the temperature sensor circuit 113 to operate. Therefore, the temperature sensor circuit 113 starts the circuit operation to enable the overheat protection function.

What is claimed is:

1. A battery state monitoring circuit, comprising:
a charge/discharge control circuit for detecting and controlling a state of a secondary battery;
an automatic recovery circuit coupled to the charge/discharge control circuit and coupled to positive and negative terminals of the second battery;
a temperature sensor circuit coupled to an output terminal of the automatic recovery circuit and to the charge/discharge control circuit, the temperature sensor circuit operable to control the charge/discharge control circuit; and
a comparator having a positive input terminal coupled to the output terminal of the automatic recovery circuit, a negative input terminal coupled to the positive terminal of the second battery and an output terminal coupled to the temperature sensor circuit, the comparator operable to compare a voltage of the output terminal of the automatic recovery circuit and a voltage of the secondary battery, and output a signal indicative of a result of the comparison to the temperature sensor circuit, to control an operation of the temperature sensor circuit;

wherein the temperature sensor circuit suspends and starts the operation in response to the signal from the comparator, thereby activating the temperature sensor circuit upon detection that a charger is connected.

2. A battery state monitoring circuit, comprising:
a charge/discharge control circuit for detecting and controlling a state of a secondary battery, the charge/discharge control circuit comprising a 0V charge control circuit;
an automatic recovery circuit coupled to the charge/discharge control circuit and coupled to positive and negative terminals of the second battery;
a temperature sensor circuit coupled to an output terminal of the automatic recovery circuit and to the charge/discharge control circuit, the temperature sensor circuit operable to control the charge/discharge control circuit;
a discharge control output terminal;
a charge control output terminal;
an overcurrent detection terminal;
an N-channel transistor including a gate connected to an output of the 0 V charge control circuit, a source connected to a negative terminal of the secondary battery, and a drain connected to the charge control output terminal; and
a comparator having a positive input terminal coupled to the output terminal of the automatic recovery circuit, a negative input terminal coupled to the positive terminal of the second battery and an output terminal coupled to the temperature sensor circuit, the comparator operable to compare a voltage of an output terminal of the automatic recovery circuit and a voltage of the secondary battery, and output a signal indicative of a result of the comparison to the temperature sensor circuit, to control an operation of the temperature sensor circuit
wherein the temperature sensor circuit suspends the operation and starts the operation in response to the signal from the comparator when a voltage at the overcurrent detection terminal is higher than a voltage at the positive terminal of the second battery, thereby activating the temperature sensor circuit upon detection that a charger is connected.

3. A battery state monitoring circuit, comprising:
a charge/discharge control circuit for detecting and controlling a state of a secondary battery, the charge/discharge control circuit comprising a 0V charge control circuit;
an automatic recovery circuit coupled to the charge/discharge control circuit and coupled to positive and negative terminals of the second battery;
a temperature sensor circuit coupled to an output terminal of the automatic recovery circuit and to the charge/discharge control circuit, the temperature sensor circuit operable to control the charge/discharge control circuit;
a discharge control output terminal;
a charge control output terminal;
an overcurrent detection terminal;
a P-channel transistor including a gate connected to an output of the 0 V charge control circuit, a source connected to a positive terminal of the secondary battery, and a drain connected to the charge control output terminal; and
a comparator having a positive input terminal coupled to the output terminal of the automatic recovery circuit, a negative input terminal coupled to the positive terminal of the second battery and an output terminal coupled to the temperature sensor circuit, the comparator operable to compare a voltage of an output terminal of the automatic recovery circuit and a voltage of the secondary battery, and output a signal indicative of a result of the comparison to the temperature sensor circuit, to control an operation of the temperature sensor circuit;
wherein the temperature sensor circuit suspends the operation and starts the operation in response to the signal from the comparator when a voltage at the overcurrent detection terminal is higher than a voltage at the positive terminal of the second battery, thereby activating the temperature sensor circuit upon detection that a charger is connected.

4. A battery device, comprising:
a chargeable/dischargeable secondary battery;
a charge/discharge control switch provided in a charge/discharge path of the chargeable/dischargeable secondary battery; and
the battery state monitoring circuit according to claim 1, for monitoring a voltage of the chargeable/dischargeable secondary battery, and opening/closing the charge/discharge control switch, to control charge/discharge of the chargeable/dischargeable secondary battery.

5. A battery device, comprising:
a chargeable/dischargeable secondary battery;
a charge/discharge control switch provided in a charge/discharge path of the chargeable/dischargeable secondary battery; and
the battery state monitoring circuit according to claim 2, for monitoring a voltage of the chargeable/dischargeable secondary battery, and opening/closing the charge/discharge control switch, to control charge/discharge of the chargeable/dischargeable secondary battery.

6. A battery device, comprising:
a chargeable/dischargeable secondary battery;
a charge/discharge control switch provided in a charge/discharge path of the chargeable/dischargeable secondary battery; and
the battery state monitoring circuit according to claim 3, for monitoring a voltage of the chargeable/dischargeable secondary battery, and opening/closing the charge/discharge control switch, to control charge/discharge of the chargeable/dischargeable secondary battery.

* * * * *